United States Patent
Tao et al.

(10) Patent No.: US 12,464,674 B2
(45) Date of Patent: Nov. 4, 2025

(54) HEAT DISSIPATION APPARATUS AND ELECTRONIC DEVICE

(71) Applicants: ZTE Corporation, Shenzhen (CN); Institute of Spacecraft System Engineering, Beijing (CN)

(72) Inventors: Cheng Tao, Shenzhen (CN); Yalong Wang, Beijing (CN); Fan Liu, Shenzhen (CN); Shuai Li, Shenzhen (CN); Xingang Yu, Beijing (CN)

(73) Assignees: ZTE Corporation, Shenzhen (CN); Institute of Spacecraft System Engineering, Beijing (CN)

( * ) Notice: Subject to any disclaimer, the term of this patent is extended or adjusted under 35 U.S.C. 154(b) by 217 days.

(21) Appl. No.: 18/265,757

(22) PCT Filed: Sep. 26, 2021

(86) PCT No.: PCT/CN2021/120765
§ 371 (c)(1),
(2) Date: Jun. 7, 2023

(87) PCT Pub. No.: WO2022/134706
PCT Pub. Date: Jun. 30, 2022

(65) Prior Publication Data
US 2024/0040743 A1 Feb. 1, 2024

(30) Foreign Application Priority Data
Dec. 21, 2020 (CN) .......................... 202011517457.1

(51) Int. Cl.
*H05K 7/20* (2006.01)
(52) U.S. Cl.
CPC ............................... *H05K 7/20254* (2013.01)

(58) Field of Classification Search
CPC .......... H05K 7/20254; H05K 7/20272; H05K 7/20772; H05K 7/20218; H05K 7/20509; G06F 1/20
See application file for complete search history.

(56) References Cited

U.S. PATENT DOCUMENTS

| 5,465,192 A | 11/1995 | Yoshikawa |
| 6,796,372 B2 * | 9/2004 | Bear ....................... F28F 13/00 165/185 |

(Continued)

FOREIGN PATENT DOCUMENTS

| CN | 101901036 A | 12/2010 |
| CN | 204335279 U | 5/2015 |

(Continued)

OTHER PUBLICATIONS

Aoki Hitoshi; Kubota Junichi; Komatsubara Takeo; Mogi Junichi; Kakinuma Hirotaka, "Structure and Method for Connection of Cold Plate", Sep. 13, 2002, Sanyo Electric Co., Entire Document (Translation of JP2002261223). (Year: 2002).*

(Continued)

*Primary Examiner* — Stephen S Sul
(74) *Attorney, Agent, or Firm* — Wolf, Greenfield & Sacks, P.C.

(57) ABSTRACT

Disclosed are a heat dissipation apparatus and an electronic device. The heat dissipation apparatus may include: a cooling component, comprising at least two cooling plates in which a flow channel for containing a working medium is arranged; and a first tube, through which the cooling plates are connected, allowing the flow channels of the cooling plates to be communicated with each other, at least part of the first tube being an extendable corrugated tube.

14 Claims, 3 Drawing Sheets

(56) References Cited

U.S. PATENT DOCUMENTS

| | | | | |
|---|---|---|---|---|
| 7,372,698 | B1* | 5/2008 | Tilton | H05K 7/20772 |
| | | | | 361/698 |
| 7,508,665 | B1* | 3/2009 | Palmer | H05K 7/2079 |
| | | | | 361/696 |
| 10,237,999 | B2* | 3/2019 | Lunsman | H05K 7/1489 |
| 10,966,354 | B1* | 3/2021 | Shao | H05K 7/2079 |
| 11,019,752 | B2* | 5/2021 | Gao | H05K 7/20781 |
| 11,157,050 | B1* | 10/2021 | Lunsman | H05K 7/20509 |
| 11,592,882 | B2* | 2/2023 | Nicholas | F28D 15/0208 |
| 2003/0081534 | A1 | 5/2003 | Omori | |
| 2003/0188539 | A1* | 10/2003 | Abras | F24H 1/162 |
| | | | | 219/544 |
| 2005/0128705 | A1* | 6/2005 | Chu | H01L 23/473 |
| | | | | 361/689 |
| 2005/0180107 | A1 | 8/2005 | Naganawa et al. | |
| 2005/0241799 | A1* | 11/2005 | Malone | G06F 1/20 |
| | | | | 165/80.1 |
| 2005/0241803 | A1* | 11/2005 | Malone | G06F 1/20 |
| | | | | 165/80.4 |
| 2014/0071624 | A1* | 3/2014 | Aoki | H01L 23/34 |
| | | | | 165/104.31 |
| 2016/0216048 | A1 | 7/2016 | Tsai et al. | |
| 2018/0031329 | A1* | 2/2018 | Wang | F28D 15/046 |
| 2018/0116075 | A1* | 4/2018 | Fukunaga | H05K 7/1487 |

FOREIGN PATENT DOCUMENTS

| | | |
|---|---|---|
| CN | 205491603 U | 8/2016 |
| CN | 208226288 U | 12/2018 |
| CN | 209041821 U | 6/2019 |
| CN | 209445862 U | 9/2019 |
| CN | 110662389 A | 1/2020 |
| CN | 210666638 U | 6/2020 |
| CN | 211575317 U | 9/2020 |
| CN | 112612353 A | 4/2021 |
| EP | 1 150 284 A2 | 10/2001 |
| EP | 1 564 808 A1 | 8/2005 |
| JP | H07-142656 A | 6/1995 |
| JP | 2002261223 A * | 9/2002 |
| TW | M611414 U | 5/2021 |

OTHER PUBLICATIONS

International Search Report and Written Opinion for International Application No. PCT/CN2021/120765, mailed Dec. 28, 2021.
PCT/CN2021/120765, Dec. 28, 2021, International Search Report and Written Opinion.
First Office Action and Search Report for Chinese Application No. 202011517457.1, dated Apr. 16, 2025.
Second Office Action and Supplementary Search Report for Chinese Application No. 202011517457.1, dated Sep. 4, 2025.

* cited by examiner

HEAT DISSIPATION APPARATUS AND ELECTRONIC DEVICE

CROSS-REFERENCE TO RELATED APPLICATION

This application is a national stage filing under 35 U.S.C. § 371 of international application number PCT/CN2021/120765, filed Sep. 26, 2021, which claims priority to Chinese patent application No. 202011517457.1, filed Dec. 21, 2020. The contents of these applications are incorporated herein by reference in their entirety.

TECHNICAL FIELD

The present disclosure relates to, but is not limited to, the technical field of servers, and more particularly, to a heat dissipation apparatus and an electronic device applying the same.

BACKGROUND

With the increasing power consumption of chips, liquid cooling schemes are increasingly being adopted in the field of electronic heat dissipation. Taking a communication single board as an example, when a plurality of chips requires liquid cooling, it is necessary to design a cooling plate for each chip, which has an internal channel for liquid to flow through. The cooling plates cover the chips to remove the heat of the chips through the flow of the liquid, so as to achieve the purpose of heat dissipation for cooling. When there is a difference in height between different chips, it is difficult to ensure a complete fit between each chip and the cooling plate.

In some technical schemes, the floating connection between the cooling plates is achieved through rigid metal tubes, such as copper tubes. These metal tubes have certain flexibility and can be adapted to certain height differences. However, the design of the cooling plates has high requirements on the parameters (tube diameter, wall thickness, etc.) of the copper tubes and tube layout, which will greatly limit the design and pressure resistance of the cooling plates. A one-plate heat sink is also adopted for heat dissipation. An interface material with high tolerance, such as a heat-conducting pad or an elastic metal sheet, is added between a plurality of chips and cooling plates to absorb high difference, so as to ensure the fit between the chips and the cooling plates. However, the one-plate heat sink occupies too much space, greatly limiting its application, cannot achieve a complex connection structure, requires high flatness control, and is high in cost, making it difficult to implement.

SUMMARY

The following is a summary of the topic described in detail herein. This summary is not intended to limit the protection scope of the claims.

Embodiments of the present disclosure provide a heat dissipation apparatus and an electronic device, which at least solve one of the related technical problems to a certain extent, including the problem caused by the height differences between different chips.

In accordance with an aspect of the present disclosure, an embodiment provides a heat dissipation apparatus. The apparatus includes: a cooling component, including at least two cooling plates in which a flow channel for containing a working medium is arranged; and a first tube, through which the cooling plates are connected with each other, allowing the flow channels of the cooling plates to be communicated with each other, at least part of the first tube being an extendable corrugated tube.

In accordance with another aspect of the present disclosure, an embodiment of the present disclosure further provides an electronic device. The device includes at least two chips and the heat dissipation apparatus according to the embodiment above. The cooling plates are attached to the chips and configured to dissipate heat of the chips.

Other features and advantages of the present disclosure will be set forth in the description below, and will partially become apparent from the description, or may be understood by practicing the present disclosure. The objective and other advantages of the present disclosure can be achieved and acquired by the structure particularly specified in the description, the claims, and the accompanying drawings.

BRIEF DESCRIPTION OF DRAWINGS

The accompanying drawings are used to provide a further understanding of the technical scheme of the present disclosure and constitute a part of the description. The accompanying drawings are used together with the embodiments of the present disclosure to explain the technical scheme of the present disclosure, and do not constitute a limitation to the technical scheme of the present disclosure.

REFERENCE NUMERALS

Figure 1:
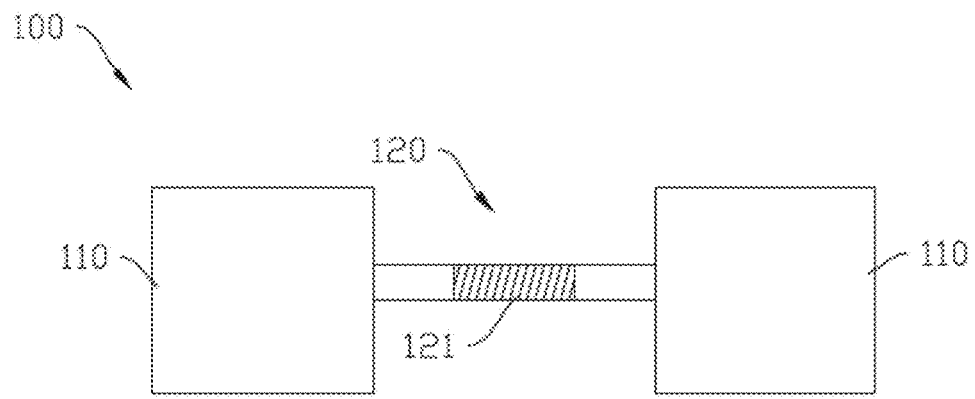
FIG. 1 is a top structural view of a heat dissipation apparatus according to an embodiment of the present disclosure.

Heat dissipation apparatus 100; Cooling plate 110; First tube 120; Corrugated tube 121; Second tube 130; Third tube 140; Heat-conducting layer 150; and Chip 200.

DETAILED DESCRIPTION

In order to make the objective, technical scheme and advantages of the present disclosure clear, the present disclosure will be further described in detail below in conjunction with the accompanying drawings and embodiments. It should be understood that the specific embodiments described herein are merely used to illustrate the present disclosure, and are not intended to limit the present disclosure.

In the description of the present disclosure, it should be understood that directional descriptions involved, e.g. directions and positional relationships indicated by "up", "down" and the like, are based on the directions or positional relationships shown in the accompanying drawings, and are merely intended to facilitate and simplify the description of the present disclosure rather than indicate or imply that the indicated device or elements must have specific directions and be structured and operated according to the specific directions, and therefore cannot be understood as a limitation to the present disclosure.

It is to be noted, although functional modules have been divided in the schematic diagrams of apparatuses and logical orders have been shown in the flowcharts, in some cases, the modules may be divided in a different manner, or the steps shown or described may be executed in an order different from the orders as shown in the flowcharts. The terms such as "first", "second" and the like in the description, the claims, and the accompanying drawings are used to distinguish similar objects, and are not necessarily used to describe a specific sequence or a precedence order.

In an embodiment according to the present disclosure, the heat of chips 200 is dissipated by a cooling component, and more than two cooling plates 110 are connected through a first tube 120, so that flow channels of the cooling plates 110 can be communicated with each other. During working, a working medium flows along the flow channels and exchanges heat with the chips 200, to take away the heat generated by the chips 200, thereby achieving the purpose of cooling with high cooling efficiency. At least part of the first tube 120 is provided with a corrugated tube 121. Compared with the metal tubes adopted in some technical schemes, the corrugated tube 121 has better flexibility and thus can be adapted to the height differences between the cooling plates 110 caused by the differences between the different chips 200, effectively enhancing the floating capability between the cooling plates 110. Therefore, the chips 200 with different heights can be in close contact with the cooling plates 110, realizing a more flexible tube layout, a higher pressure resistance, a reasonable structural design and easy implementation. Moreover, the corrugated tube 121 helps increase the turbulence degree of the flow of the working fluid, enhancing the heat exchange capability of the fluid, thereby achieving better heat dissipation effect.

The embodiments of the present disclosure will be further described below in conjunction with the accompanying drawings. That is, the heat dissipation apparatus 100 according to the embodiments of the present disclosure will be described with reference to FIGS. 1 to 6.

Referring to FIG. 1, FIG. 1 shows a heat dissipation apparatus 100 according to an embodiment of the present disclosure. The apparatus 100 includes a cooling component. The cooling component includes at least two cooling plates 110 which are provided with a flow channel inside for containing a working medium. The flow channels of the cooling plates 110 are connected through a first tube 120 to form a fluid channel, so that the working medium can flow along the fluid channel. Each cooling plate 110 can be attached to one chip 200 for heat dissipation. During working, the working medium flows along the fluid channels and exchanges heat with the chips 200 in the fluid channels to take away the heat generated by the chips 200, so that the chips 200 are cooled, achieving the purpose of cooling. The cooling efficiency is high, thereby ensuring that the chips 200 can operate stably.

It can be understood that the height differences between different chips 200 will lead to height differences between the cooling plates 110 when the cooling plates 110 are attached to the chips 200. In order to enable the first tube 120 to match the different height differences, at least part of the first tube 120 adopted in the embodiments of the present disclosure uses the corrugated tube 121. That is, it can be understood as follows: the first tube 120 is provided with a corrugated section, i.e., part of the first tube 120 is the corrugated tube 121, and the corrugated section may be located at any position of the tube body. Alternatively, the entire first tube 120 may be the corrugated tube 121. It can be easily understood that a wall of the corrugated tube 121 is of a corrugated structure and therefore can be collapsed or extended, such that the corrugated tube 121 can be extended or compressed in an axial direction and offset in a radial direction. For example, the corrugated tube 121 can be bent in any direction, and therefore is flexible and convenient to use.

Figure 2:
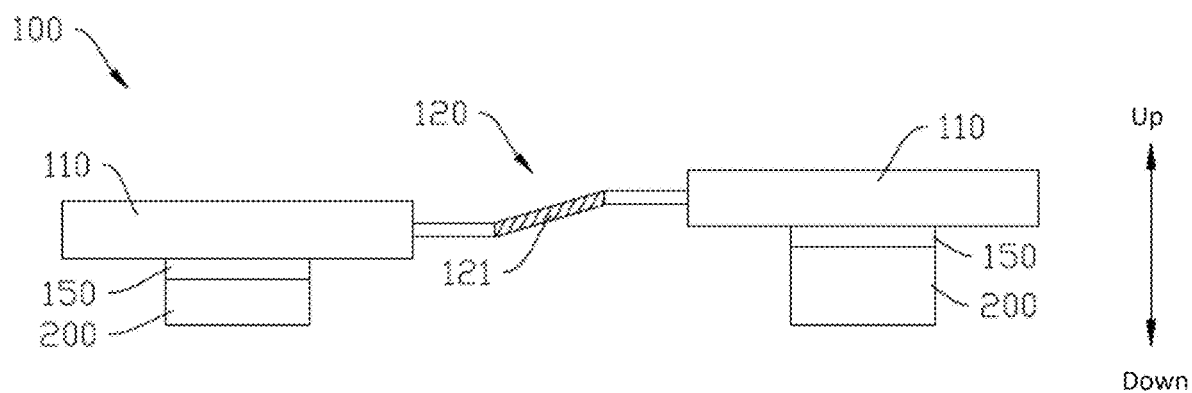
FIG. 2 is a side structural view of the connection between the heat dissipation apparatus and chips according to an embodiment of the present disclosure.

Referring to FIG. 1 and FIG. 2, taking the connection structure of two cooling plates 110 as an example for illustration, the two cooling plates 110 are connected through the first tube 120, with the flow channels inside the cooling plates 110 not shown. It can be understood that each of cooling plates 110 is provided with a liquid inlet and a liquid outlet which are communicated with the flow channel. The liquid outlet of one cooling plate 110 is connected with the liquid inlet of the other cooling plate 110 through the first tube 120, such that the flow channels of the two cooling plates 110 can be communicated with each other. The working medium enters the flow channel from the liquid inlet of one cooling plate 110, flows out of the liquid outlet of the one cooling plate 110 after heat exchange, and enters the flow channel of the other cooling plate 110. In this way, the working medium sequentially passes through the cooling plates 110 along the fluid channels, to cool the chips 200.

Referring to FIG. 2, the two cooling plates 110 are respectively attached to the top of corresponding chips 200 having different heights. As a result, there exists a height difference when the two cooling plates 110 are attached to respective chips 200. The first tube 120 connected between the two cooling plates 110 can be adapted to the height difference between the two cooling plates 110 through the corrugated tube 121, such that the first tube 120 can be tightly connected with the cooling plates 110, without affecting the stability of the cooling plates 110. Compared with the straight metal tube adopted in some technical schemes, the corrugated tube 121 is more flexible and pressure-resistant, and can be extended according to the height difference between the two cooling plates 110. The corrugated tube 121 can provide a larger floating space between the cooling plates 110, allowing a stronger floating capability between the cooling plates 110 stronger and a more flexible tube layout.

It should be noted that the corrugated tube 121 can be extended in the axial direction, and therefore can be adapted to the horizontal distance between the cooling plates 110 by being extended. As shown in FIG. 2, the first tube 120 can match the positions of the cooling plates 110 in vertical and horizontal directions through the corrugated tube 121. It can be understood that the longer the length of the corrugated tube 121 is, the wider the range of adjustment of the first tube 120 is. That is, the cooling plates 110 have a larger floating space. Here, the floating capability of the cooling plates 110 can be understood as the range of adjustment of the cooling plates 110 in a height direction. The length of the corrugated tube 121 is chosen according to actual application requirements, and the size of the corrugated tube 121 is not further limited.

It can be understood that there are a plurality of chips 200 on a single communication board each provided with a corresponding cooling plate 110, and all the cooling plates 110 are connected through the first tube 120. The working medium flows through all the cooling plates 110 to cool the chips 200. In the embodiments, the working medium used is a fluid, which may be single-phase fluorinated liquid, water, other solutions containing water, etc., or may be a phase-change working medium, such as tetrafluoroethane (R134a). Certainly, in the embodiments, the working medium is driven to flow by a driver. For example, a pump is used to pump the working medium into the flow channels, so that the working medium can flow and carry away the heat of the chips 200. It should be noted that when the working medium flows to the position of the corrugated tube 121, a corrugated structure of an inner wall of the corrugated tube 121 can make the flow of the working medium turbulent, and as the working medium flows along the corrugated tube 121, the degree of turbulence is increased to cause the working medium to flow more violently, thereby enhancing the heat exchange capability of the fluid and achieving a better heat dissipation effect.

Referring to FIG. 2, in some embodiments, the first tube 120 adopts a tube structure which is partially provided with the corrugated tube 121. In an embodiment, a middle part of the first tube 120 is provided with the corrugated tube 121, and both ends of the first tube 120 are straight tubes. That is, the first tube 120 includes a corrugated section and straight sections. Here, the straight tube can be understood as a tube body with a smooth wall, and the shape of straight tube is not limited to the overall shape of the tube body, which may be a straight tube shape or a curved tube shape. The first tube 120 is connected with the cooling plates 110 through the straight tubes at both ends, with one end of the first tube 120 connected with the liquid inlet of one cooling plate 110 and the other end of the first tube 120 connected with the liquid outlet of the other cooling plate 110, thereby realizing the communication between the flow channels of the cooling plates 110.

The straight tube is provided with a smooth wall, which makes it easier to connect with the cooling plates 110, realizing a more stable and firm connection structure and higher tightness. For example, both ends of the first tube 120 can be fixedly inserted into the corresponding liquid inlet and liquid outlet, which is convenient for installation and operation and the structure is stable and reliable. It can be understood that when there exists a height difference between the cooling plates 110, the tube body of the corrugated tube 121 will be adjusted adaptively, thereby, without a bend of the tube bodies of the straight tubes, eliminating the influence caused by the height difference and meeting the requirement of the tube layout.

It should be noted that the corrugated structure of the corrugated tube 121 is distributed in the axial direction of the tube body, and the corrugated shape may be annular or helical. It can be understood that the annular corrugated shape may be understood as a foldable part of the tube wall being distributed in the form of rings at intervals, so that the tube wall can be extended or compressed at the annular foldable part, and the corrugated tube 121 with the annular corrugated shape can meet the adjustment of radial bending and axial extending. The helical corrugated shape may be understood as a foldable part of the tube wall being helical, so that the tube wall can be extended or compressed at the helical foldable part. The corrugated tube 121 with the helical corrugated shape is more conducive to axial extending for adjustment.

In an embodiment, the annular or helical corrugated shape is chosen according to the requirement of an actual application scenario of the corrugated tube 121. For example, when a higher floating capacity is required between the cooling plates 110, the corrugated tube 121 with the annular corrugated shape is chosen since the range of adjustment of the corrugated tube 121 in the radial direction is wider; and when the corrugated tube 121 is required to have a longer adjustment distance in the horizontal direction, the corrugated tube 121 with the helical corrugated shape is chosen. Therefore, the structural design can be more reasonable. It should be noted that the corrugated shape of the corrugated tube 121 also involves parameters, such as ring spacing, inner diameter of the corrugated tube 121, pressure resistance and flow regime of the working medium in the corrugated tube 121, which need to be designed according to actual conditions and will not be further defined here.

Figure 3:
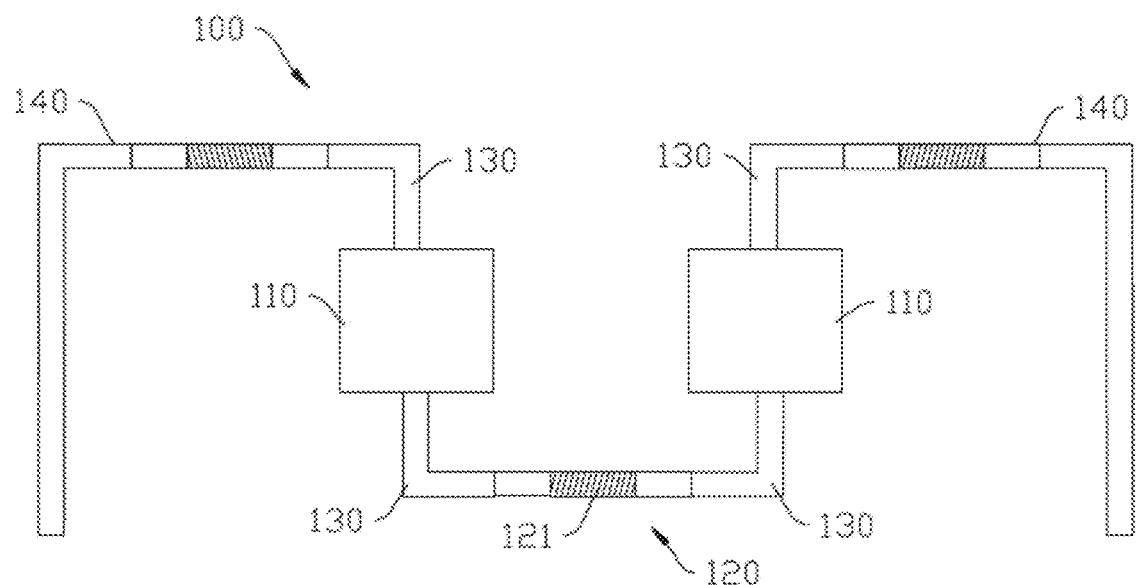
FIG. 3 is a top structural view of a heat dissipation apparatus according to another embodiment of the present disclosure.

Referring to FIG. 3, in some embodiments, the cooling plate 110 is provided with a second tube 130 at the liquid inlet and the liquid outlet respectively, and the cooling plates 110 are connected through the first tube 120 and the second tubes 130. In an embodiment, the length of the second tubes 130 is chosen according to an actual requirement, and the second tubes 130 are then connected to the liquid inlet and the liquid outlet. That is, one second tube 130 is connected to the liquid inlet and the other second tube 130 is connected to the liquid outlet. The second tubes 130 are then connected to the first tube 120, to connect two cooling plates 110 together. In the embodiments, the second tube 130 is a straight tube. It should be noted that the second tube 130 being a straight tube may be understood as that the wall of the second tube 130 is smooth, rather than defining the shape of the second tube 130. The second tube 130 may be of a straight tube shape or a curved tube shape. For example, the second tube 130 may be L-shaped, T-shaped, etc. Both ends of the first tube 120 are straight tubes, and the middle of the first tube 120 is the corrugated tube 121. One end of the first tube 120 is connected with the second tube 130 at the liquid inlet of one cooling plate 110, and the other end of the first tube 120 is connected with the second tube 130 at the liquid outlet of the other cooling plate 110. It can be understood that since the first tube 120 and the second tube 130 adopt a straight-tube-to-straight-tube connection structure, the connection is easier to implement, and the connection structure has higher tightness and firmness.

It should be noted that both the first tube 120 and the second tube 130 are made of a metal material. During installation, the second tubes 130 and the cooling plates 110 are welded together first, or the cooling plates 110 and the second tubes 130 are integrally molded. Then, both ends of the first tube 120 are connected to the second tubes 130 on the cooling plates 110, respectively. The first tube 120 and the second tubes 130 are fixed by welding, so that the cooling plates 110 are connected together through the first tube 120 and the second tubes 130. Since the first tube 120 and the second tubes 130 welded are straight tubes, the welded structure is more stable and reliable. It can be understood that, compared with flexible tubes made of plastic or other materials, the tubes made of the metal material have higher pressure resistance, thereby preventing leakage caused by the aging of tubes, and the corrugated tube 121 made of the metal material helps increase the strength of the tube body. Therefore, the service life is longer, and the overall reliability of the heat dissipation apparatus 100 is effectively increased.

It can be understood that the first tube 120 and the second tubes 130 may adopt the same metal material. For example, both the first tube 120 and the second tubes 130 are copper tubes. Different metal materials may also be adopted. For example, the first tube 120 is a copper tube, while the second tubes 130 are stainless steel tubes. Different metal materials may be chosen according to the requirements of actual scenarios.

Figure 6:
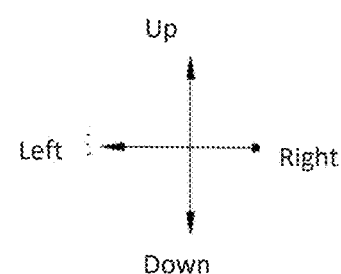
FIG. 6 is a side structural view of the connection between the heat dissipation apparatus and chips according to an embodiment of the present disclosure.
Figure 6:
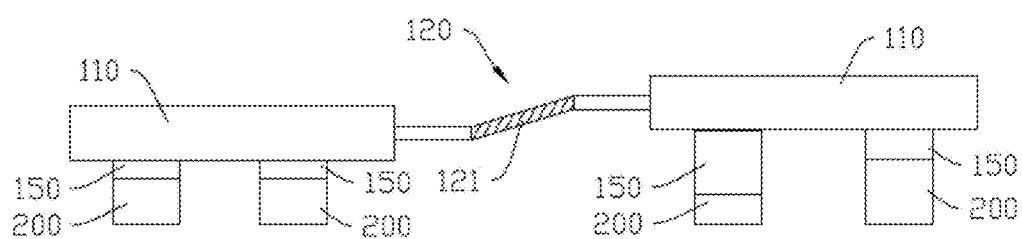

Referring to FIG. 2 and FIG. 6, in some embodiments, a heat-conducting layer 150 is arranged between the cooling plate 110 and the chip 200. With a heat conducting function, the heat-conducting layer 150 can quickly transfer the heat generated by the chip 200 to the cooling plate 110, and the heat is taken away by the flowing working medium, so that the efficiency of heat dissipation is effectively increased. It can be understood that the heat-conducting layer 150 is located between an upper surface of the chip 200 and the bottom of the cooling plate 110. The heat-conducting layer 150 adopts a material with good heat-conducting property and insulating property, such as heat-conducting silicone grease or heat-conducting pad. Since different materials have different heights, different materials can be chosen on the chips 200 with different heights. For example, because the heat-conducting layer 150 made of the heat-conducting pad will have a larger height than the heat-conducting layer 150 made of the heat-conducting silicone grease, the heat-conducting pad can be arranged on the chip 200 with a relatively small height, and the heat-conducting silicone grease can be arranged on the chip 200 with a relatively large height. Thus, when the two cooling plates 110 are covered on the corresponding chips 200, the height difference between the two chips 200 can be reduced by the heights of the different heat-conducting layers 150. Thus, the floating capability of the cooling plates 110 can be increased by choosing different materials for the heat-conducting layers according to different application scenarios.

Referring to FIG. 6, two cooling plates 110 are connected through a first tube 120 and second tubes 130, and each cooling plate 110 is connected with two chips 200 at the bottom. The two chips 200 located at the bottom of the cooling plate 110 on the left have the same height or a small height difference. In this case, a same material (e.g., heat-conducting silicone grease) may be adopted between the two chips 200 and the cooling plate 110 for heat conduction, to enable the cooling plate 110 to keep horizontal when covering the two chips 200. In contrast, the heights of the two chips 200 located at the bottom of the cooling plate 110 on the right are different. In this case, a heat-conducting pad is arranged between the chip 200 with a relatively small height and the cooling plate 110, and heat-conducting silicone grease is arranged between the chip 200 with a relatively large height and the cooling plate 110, such that the cooling plate 110 can be kept horizontal when covering the chips 200 with the different heights. Thus, the connection method for the cooling plates 110 and the chips 200 is more flexible, to achieve a more reasonable structure and a satisfactory flatness of the cooling plates 110.

It should be noted that in addition to the aforementioned connection method shown in FIG. 6, other different connection methods may also be employed in the embodiments, adjustments may be made according to actual scenarios, and the number of the chips 200, the material of the heat-conducting layer 150 and other settings are not further defined.

It can be understood that a plurality of cooling plates 110 may be connected through first tubes 120 and second tubes 130 and connected to the outside through third tubes 140, so that the first tubes 120, the second tubes 130, the third tubes 140 and flow channels are connected to form a fluid loop, which may be understood as a closed loop to enable the working medium to circulate along the fluid loop. It can be understood that the working medium can be pumped into the fluid loop from the third tube 140 by a pump, so that the working medium can flow along the fluid loop to take away the heat of the chips 200, dissipating the heat of the chips 200. The high-temperature working medium can exchange heat through a heat exchanger arranged outside, such that the working medium can be turned into a low-temperature state after heat exchange and flow back into the fluid loop, thus achieving the purpose of circulated cooling. The third tube 140 may be a straight tube or a tube with a corrugated tube 121, and different types of tubes may be chosen according to the requirements of actual application scenarios, further increasing the flexibility of tube layout and making the design more reasonable, which will not be repeated here.

Figure 4:
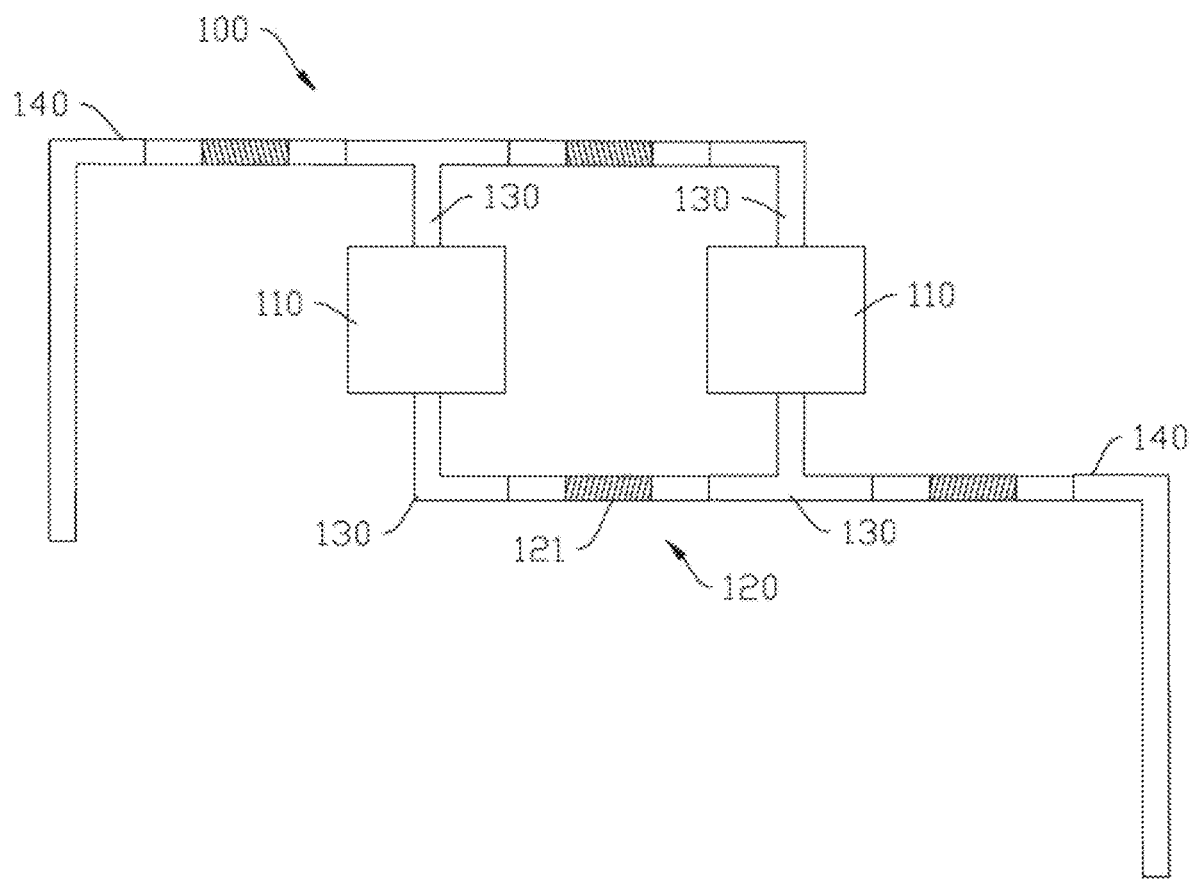
FIG. 4 is a top structural view of a heat dissipation apparatus according to another embodiment of the present disclosure.
Figure 5:
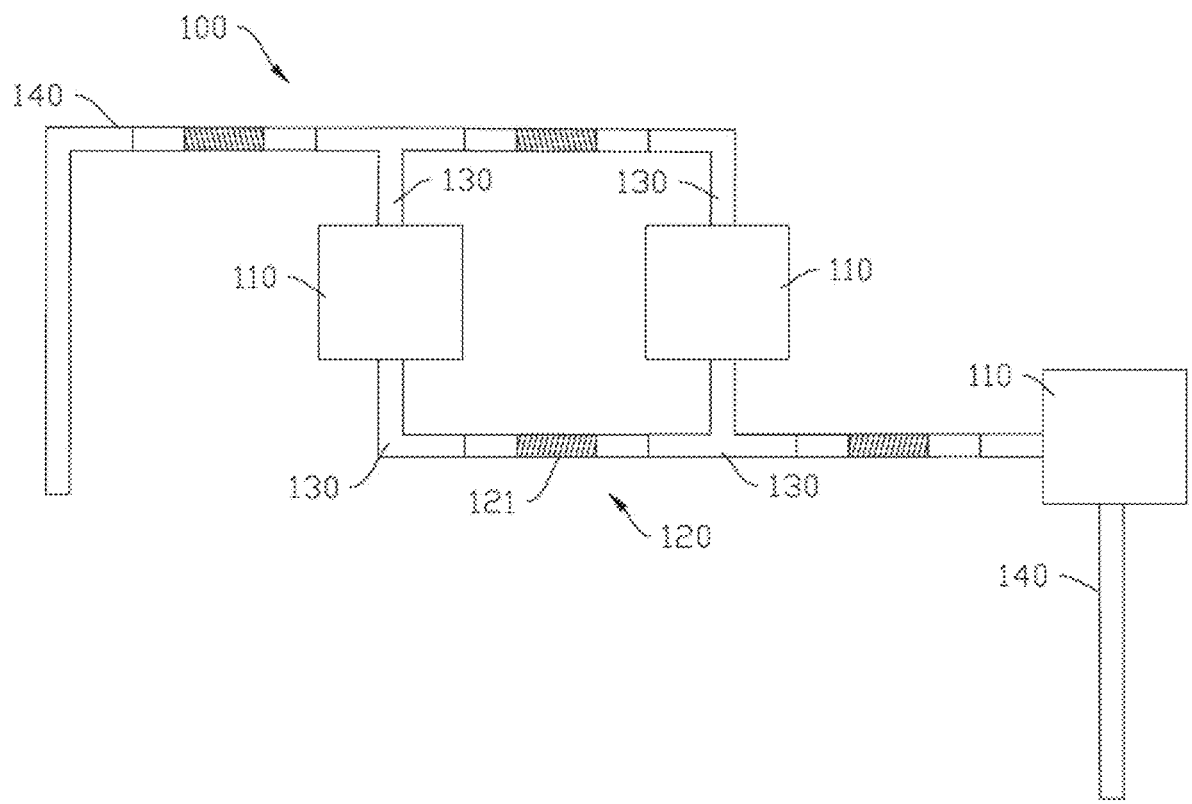
FIG. 5 is a top structural view of a heat dissipation apparatus according to another embodiment of the present disclosure.

Referring to FIG. 4 and FIG. 5, it should be noted that the plurality of cooling plates 110 may be connected in series or in parallel. As shown in FIG. 4, taking two cooling plates 110 as an example, the two cooling plates 110 are connected in parallel, and then are connected to the outside through third tubes 140 to form a fluid loop. As shown in FIG. 5, taking three cooling plates 110 as an example, two of the cooling plates 110 are connected in parallel and then connected in series with another cooling plate 110. Since different connection methods may be chosen according to the requirements of actual application scenarios, the connection method is more flexible, the structural design is more reasonable, and therefore the application range is wider.

Taking the embodiment shown in FIG. 3 as an example, a production process of the heat dissipation apparatus 100 will be described.

In an embodiment, the first tube 120 may be made of copper or stainless steel. The corrugated tube 121 may be formed by hydraulic pressure, mechanical expansion, a corrugating machine, etc., and the corrugated shape may be helical or annular. It can be understood that the helical corrugated tube 121 is more conducive to axial adjustment, and has higher strength than the annular corrugated tube 121, whereas the annular corrugated tube 121 can provide a larger floating space for the cooling plates 110 than the helical corrugated tube 121, and can support axial and radial floating at the same time, making the usage more flexible. Therefore, different corrugated tubes 121 may be chosen in the design of the heat dissipation apparatus 100 according to the requirements of actual application scenarios. For example, if the height difference between the chips 200 only exists along the height direction, the annular or helical corrugated tube 121 may be chosen. If the differences between design dimensions of the chips 200 exist in both the height direction and horizontal direction, the annular corrugated tube 121 is adopted, so as to match the axial distance difference while the tube floats radially.

In addition, in the process of welding the first tube 120 and the second tube 130, if a stainless steel tube and a copper tube are welded, flame brazing may be adopted, and a silver-based material is chosen as a welding wire, preferably a WEWELDING welding wire; or high-frequency induction welding may also be adopted. If a copper tube is welded to a copper tube, fusion welding is directly adopted for welding, and the specific welding process will not be repeated.

The heat dissipation apparatus 100 according to the present disclosure can be applied to various electronic devices, e.g., routers, switches, servers, and the like. The heat dissipation apparatus 100 adopting any of the structures as shown in FIGS. 1 to 6 can be used, which will not be repeated here.

In an embodiment, in the state of the cooling plates 110, a heat-conducting material, such as heat-conducting silicone grease, is arranged on the surfaces of the chips 200 first, then the cooling plates 110 are fixed on the top of the chips 200 by utilizing the spring force of screws of the cooling plates 110, and the height difference between the different chips 200 is adjusted using the first tube 120 with the corrugated tube 121, thus completing the floating connection between the cooling plates 110 at different heights and ensuring the close contact between the cooling plates 110 and the chips 200. Moreover, the corrugated structure of the corrugated tube 121 can be utilized to increase the degree of turbulence of the working medium in the tube to enhance the heat exchange effect, which is beneficial to increase the efficiency of heat dissipation.

According to the embodiments of the present disclosure, a cooling component is utilized to dissipate the heat of chips, and cooling plates are connected together through a first tube, so that flow channels of all the cooling plates can be communicated with each other. A working medium flows along the flow channels during working and exchanges heat with the chips to take away the heat generated by the chips, thereby achieving the purpose of cooling with a high cooling efficiency. At least part of the first tube is provided with a corrugated tube, and the corrugated tube has better flexibility and thus can be adapted to the height difference between the cooling plates caused by the differences between different chips, effectively enhancing the floating capability between the cooling plates. Therefore, the chips with different heights can be in close contact with the cooling plates, tube layout is more flexible, and the structural design is reasonable and easier to implement. Moreover, the corrugated tube helps increase the turbulence degree of the flow of the working fluid to enhance the heat exchange capability of the fluid, thereby achieving better heat dissipation effect.

Some embodiments of the present disclosure have been described in detail above, but the present disclosure is not limited thereto. Those having ordinary skills in the art can also make various equivalent modifications or replacements without departing from the scope of the present disclosure, and these equivalent modifications or replacements shall be included in the scope defined by the claims of the present disclosure.

What is claimed is:

1. A heat dissipation apparatus, comprising:
a cooling component, comprising at least two cooling plates in which a flow channel for containing a working medium is arranged; and
a first tube, through which the at least two cooling plates are connected, allowing the flow channel of the at least two cooling plates to be communicated with each other, at least part of the first tube being an extendable corrugated tube;
a second tube; and
a third tube;
wherein, each of the at least two cooling plates is provided with a liquid inlet and a liquid outlet which are communicated with the flow channel, the second tube is arranged at the liquid inlet and the liquid outlet, respectively, and the at least two cooling plates are connected through the first tube and the second tube, and the first tube, the second tube, and the flow channel between the at least two cooling plates that are connected in parallel and adjacent to each other are connected to form a closed fluid loop, and the third tube is used to pump the working medium into the closed fluid loop.

2. The heat dissipation apparatus of claim 1, wherein a middle part of the first tube is the extendable corrugated tube, and two ends of the first tube are straight tubes.

3. The heat dissipation apparatus of claim 1, wherein corrugations of the extendable corrugated tube are of annular or helical shape.

4. The heat dissipation apparatus of claim 1, wherein both the first tube and the second tube are metal tubes.

5. The heat dissipation apparatus of claim 4, wherein the first tube and the second tube are connected by welding.

6. The heat dissipation apparatus of claim 1, further comprising a heat-conducting layer configured to conduct heat between the at least two cooling plates and a chip.

7. The heat dissipation apparatus of claim 2, wherein corrugations of the extendable corrugated tube are of annular or helical shape.

8. An electronic device, comprising:
at least two chips; and
a heat dissipation apparatus, comprising:
a cooling component, comprising at least two cooling plates in which a flow channel for containing a working medium is arranged; and
a first tube, through which the at least two cooling plates are connected, allowing the flow channel of the at least two cooling plates to be communicated with each other, at least part of the first tube being an extendable corrugated tube;
a second tube; and
a third tube;
wherein, each of the at least two cooling plates is provided with a liquid inlet and a liquid outlet which are communicated with the flow channel, the second tube is arranged at the liquid inlet and the liquid outlet, respectively, and the at least two cooling plates are connected through the first tube and the second tube, and the first tube, the second tube, and the flow channel between the at least two cooling plates that are connected in parallel and adjacent to each other are connected to form a closed fluid loop, and the third tube is used to pump the working medium into the closed fluid loop;
wherein the at least two cooling plates are attached to the at least two chips and configured to dissipate heat of the at least two chips.

9. The electronic device of claim 8, wherein a middle part of the first tube is the extendable corrugated tube, and two ends of the first tube are straight tubes.

10. The electronic device of claim 9, wherein corrugations of the extendable corrugated tube are of annular or helical shape.

11. The electronic device of claim 8, wherein corrugations of the extendable corrugated tube are of annular or helical shape.

12. The electronic device of claim 8, wherein both the first tube and the second tube are metal tubes.

13. The electronic device of claim 12, wherein the first tube and the second tube are connected by welding.

14. The electronic device of claim 8, wherein the heat dissipation apparatus further comprises a heat-conducting layer configured to conduct heat between the at least two cooling plates and the at least two chips.

* * * * *